United States Patent
Wu

(10) Patent No.: US 10,593,807 B2
(45) Date of Patent: Mar. 17, 2020

(54) ARRAY SUBSTRATE AND FABRICATING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Wei Wu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/002,077

(22) Filed: Jun. 7, 2018

(65) Prior Publication Data

US 2019/0198677 A1 Jun. 27, 2019

Related U.S. Application Data

(63) Continuation of application No. PCT/CN2018/072717, filed on Jan. 15, 2018.

(30) Foreign Application Priority Data

Dec. 26, 2017 (CN) .......................... 2017 1 1439798

(51) Int. Cl.
*H01L 29/66* (2006.01)
*H01L 29/786* (2006.01)
(Continued)

(52) U.S. Cl.
CPC .. *H01L 29/78648* (2013.01); *H01L 29/41733* (2013.01); *H01L 29/41775* (2013.01);
(Continued)

(58) Field of Classification Search
CPC ......... H01L 29/41733; H01L 29/41775; H01L 29/42384; H01L 29/66969; H01L 29/78648; H01L 29/7869
(Continued)

(56) References Cited

U.S. PATENT DOCUMENTS 9,502,448 B2 * 11/2016 Shi ...................... H01L 29/4908
2014/0145199 A1 * 5/2014 Shi ...................... H01L 29/4908
257/72

(Continued)

FOREIGN PATENT DOCUMENTS

| CN | 104576747 A | 4/2015 |
| CN | 106252395 A | 12/2016 |
| CN | 107204309 A | 9/2017 |

*Primary Examiner* — Long K Tran
(74) *Attorney, Agent, or Firm* — Hemisphere Law, PLLC; Zhigang Ma

(57) ABSTRACT

An array substrate is disclosed, including a thin film transistor including a substrate, a first gate, a first insulating layer, an active layer, a source, a drain, a second and a third insulating layers, and a second gate. The first gate is disposed on the substrate, the first insulating layer is disposed on the first gate and the substrate, and the active layer is disposed on the first insulating layer, the source and the drain disposed on the active layer form a channel with the active layer, the second insulating layer, the third insulating layer, and the second gate are sequentially disposed in the channel region, a distance between an edge of the second insulating layer and the source and the drain is greater than a distance between an edge of the third insulating layer and the source and the drain.

8 Claims, 5 Drawing Sheets

(51) Int. Cl.
  *H01L 29/423* (2006.01)
  *H01L 29/417* (2006.01)
  *H01L 21/4757* (2006.01)
  *H01L 21/441* (2006.01)

(52) U.S. Cl.
  CPC .. *H01L 29/42384* (2013.01); *H01L 29/66969* (2013.01); *H01L 29/7869* (2013.01); *H01L 21/441* (2013.01); *H01L 21/47573* (2013.01); *H01L 2029/42388* (2013.01)

(58) Field of Classification Search
  USPC .............. 438/149, 151, 157, 166; 257/66
  See application file for complete search history.

(56) References Cited

U.S. PATENT DOCUMENTS

| | | | |
|---|---|---|---|
| 2016/0064418 A1* | 3/2016 | Shi | H01L 29/4908 438/155 |
| 2017/0263783 A1* | 9/2017 | Yamazaki | H01L 29/78648 |
| 2017/0317159 A1* | 11/2017 | Kim | H01L 29/78648 |
| 2018/0358353 A1* | 12/2018 | Gai | H01L 21/77 |

\* cited by examiner

ARRAY SUBSTRATE AND FABRICATING METHOD THEREOF

RELATED APPLICATIONS

The present application is a continuation application of International Application Number PCT/CN2018/072717, filed Jan. 15, 2018, and claims the priority of China Application No. 201711439798.X, filed Dec. 26, 2017, which is herein incorporated by reference in its entirety.

FIELD OF THE DISCLOSURE

The disclosure relates to the technical field of flat panel display fabricating, and in particular to an array substrate and a fabricating method thereof.

BACKGROUND

The array substrate is widely used in the field of flat panel display technology as a component for controlling switches and driving peripheral circuits. In the commonly used array substrate, since the pattern between the layers cannot be completely aligned and the overlapping area between the gate and the source and the drain may be partially generated, a parasitic capacitance is generated, and the generation of the parasitic capacitance to the display panel is unacceptable, which will seriously affect the performance of the display panel. Therefore, it is urgent to find a new type of array substrate structure to prevent the generation of parasitic capacitance and improve the performance of the display panel.

SUMMARY

An object of the disclosure is to provide an array substrate, which avoids the overlapping of the first gate, the second gate, the source and the drain and completely avoids the damage brought by the parasitic capacitance, so as to improve the performance of the display panel.

According to a first aspect of the disclosure there is provided an array substrate, including a thin film transistor, and the thin film transistor includes a substrate, a first gate, a first insulating layer, an active layer, a source, a drain, a second insulating layer, a third insulating layer, and a second gate; the first gate is disposed on the substrate, the first insulating layer is disposed on the first gate and extends onto the substrate, and the active layer is disposed on the first insulating layer, the active layer overlaps the first gate, the source and the drain disposed on two opposite ends of the active layer form a channel with the active layer, the second insulating layer, the third insulating layer, and the second gate are sequentially disposed in the channel region, the first gate and the third insulating layer coincide with an orthographic projection of the second gate, and a distance between an edge of the second insulating layer and the source and the drain is greater than a distance between an edge of the third insulating layer and the source and the drain.

A material of the active layer and the second gate, the source, and the drain are the same or different.

According to a second aspect of the disclosure, a fabricating method of an array substrate is provided, including the following steps:

providing a substrate and forming a first gate on the substrate, covering a first insulating layer on the first gate and the substrate, and stacking an active layer on the first insulating layer;

forming a second insulating layer material on the first insulating layer and the active layer and sequentially depositing a third insulating layer material and a photoresist layer material on the second insulating layer material;

patterning the photoresist layer from a side of the substrate away from the first gate by using the first gate as a mask to form a photoresist layer so as to make the photoresist layer coincide with an orthographic projection of the first gate;

etching the second insulating layer material and the third insulating layer material to form a second insulating layer and a third insulating layer, so as to make the third insulating layer coincide with an orthographic projection of the photoresist layer after patterning, and a distance between an edge of the second insulating layer and the source and the drain is greater than a distance between an edge of the third insulating layer and the source and the drain; and removing the photoresist layer after patterning, depositing a metal layer on the active layer to form a source, a second gate, and a drain simultaneously, and subsequently depositing other functional layers and the pixel electrode to obtain an array substrate.

In the step of etching the second insulating layer and the third insulating layer, an etching rate of two opposite sides of the third insulating layer is smaller than an etching rate of two opposite sides of the second insulating layer.

A thickness of the source and the drain is less than a sum of thicknesses of the second insulating layer and the third insulating layer.

After depositing the second gate, the step further includes depositing a fourth insulating layer on the second gate so as to make the fourth insulating layer cover the active layer, the source, the drain, the second insulating layer, the third insulating layer, and the second gate, and forming a first through hole on the fourth insulating layer by a lithography process to partially expose the second gate.

A specific operation of depositing the pixel electrode is depositing a third gate at the first through hole and depositing a fifth insulating layer on the third gate, and then forming a second through hole on the fifth insulating layer to partially expose the drain and deposit a pixel electrode at the second through hole.

A distance between an edge of the third gate and the source and the drain is greater than a distance between an edge of the second gate and the source and the drain.

A material of the second insulating layer and/or the third insulating layer includes silicon oxide, silicon nitride, silicon oxynitride, or aluminum oxide.

The first insulating layer, the second insulating layer, the third insulating layer, and the active layer have a light transmittance more than 50%.

According to the array substrate provided in the first aspect of the disclosure, the double self-aligning effect can be achieved by using the array substrate provided by the disclosure. First, the first gate and the second gate achieve the first self-aligning effect so as to make the first gate and the orthographic projection of the second gate coincide. Second, the second gate and the source and drain achieve the second self-aligning effect. Since the distance between the edge of the second insulating layer and the source and the drain is greater than the distance between the edge of the third insulating layer and the source and the drain, the second gate is naturally separated from the source and the drain when the source, the second gate, and the drain are sequentially deposited, so that the second gate does not overlap the source and the drain, and no parasitic capacitance is generated. In addition, since the first gate and the second gate achieve the first self-aligning effect, the first gate and the source and drain also have no overlapping region and no parasitic capacitance is generated. Therefore, the double self-aligning effect makes no overlapping region between the first gate and the second gate and the source and the drain, and fundamentally avoids the parasitic capacitance and improves the performance of the array substrate. According to the fabricating method of the array substrate provided by the second aspect of the disclosure, the double self-aligning effect can be achieved by using the method of the disclosure, so that the overlapping region between the first gate, the second gate, the source and the drain is not generated, thereby completely avoiding the generation of parasitic capacitance; and the process is simple, low cost, suitable for industrial production.

BRIEF DESCRIPTION OF THE DRAWINGS

In order to illustrate technical schemes of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following is a preferred embodiment of the disclosure, and it should be indicated that the disclosure can also be improved and modified by those skilled in the art without departing from the principle of the disclosure, and these improvements and modifications also fall within the protection scope of the claims of the disclosure.

Figure 1:
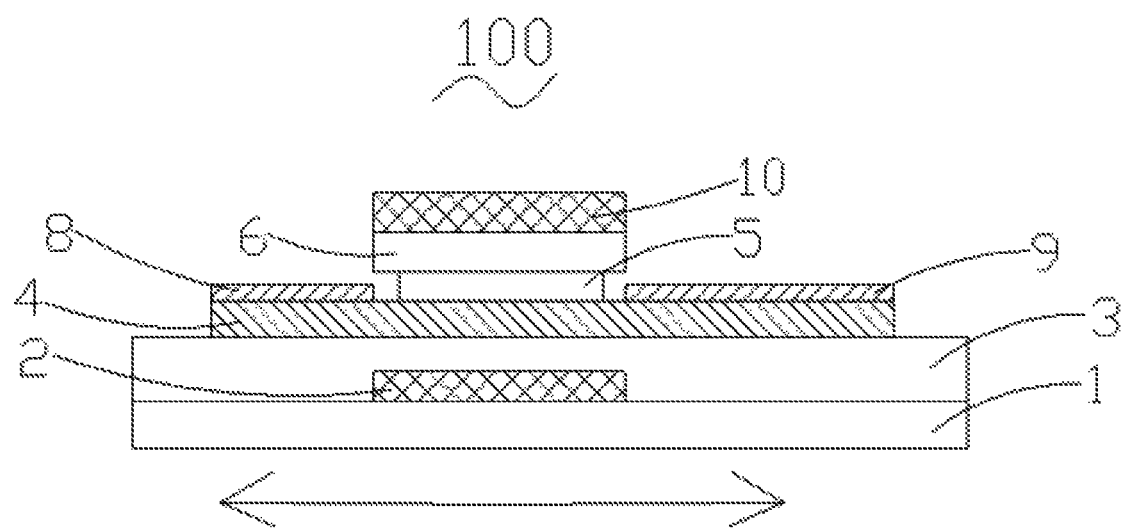
FIG. 1 is a schematic cross-sectional view of a thin film transistor of an array substrate according to an embodiment of the disclosure.

Referring to FIG. 1, an array substrate according to a first aspect of the embodiments of the disclosure includes a thin film transistor 100. The thin film transistor 100 includes a substrate 1, a first gate 2, a first insulating layer 3, an active layer 4, a source 8, a drain 9, a second insulating layer 5, a third insulating layer 6, and a second gate 10. The first gate 2 is disposed on the substrate 1. The first insulating layer 3 is disposed on the first gate 2 and extends to the substrate 1. The active layer 4 is disposed on the first insulating layer 3. The active layer 4 overlaps the first gate 2. The source 8 and the drain 9 disposed on two opposite ends of the active layer 4 form a channel with the active layer 4; the second insulating layer 5, the third insulating layer 6, and the second gate 10 are sequentially disposed in the channel region, the first gate 2 and the third insulating layer 6 coincide with an orthographic projection of the second gate 10, and a distance between an edge of the second insulating layer 5 and the source 8 and the drain 9 is greater than a distance between an edge of the third insulating layer 6 and the source 8 and the drain 9.

In particular, the coincidence mentioned in the disclosure is an effect hard to achieve, and it is impossible to achieve a perfect coincidence effect in actual products. Therefore, in the actual products, any minor deviation should also fall within the protection scope of the disclosure.

The double self-aligning effect can be achieved by using the array substrate provided by the disclosure. First, the first gate 2 and the second gate 10 achieve the first self-aligning effect so as to make the first gate 2 and the orthographic projections of the second gate 10 coincide. Second, the second gate 10 and the source 8 and drain 9 achieve the second self-aligning effect. Since the distance between the edge of the second insulating layer 5 and the source 8 and the drain 9 is greater than the distance between the edge of the third insulating layer 6 and the source 8 and the drain 9, the second gate 10 is naturally separated from the source 8 and the drain 9 when the source 8, the second gate 10, and the drain 9 are sequentially deposited, so that the second gate 10 does not overlap the source 8 and the drain 9, and no parasitic capacitance is generated. Moreover, since the first gate 2 and the second gate 10 achieve the first self-aligning effect, the first gate 2, the source 8 and the drain 9 also have no overlapping region and no parasitic capacitance is generated. Therefore, the double self-aligning effect makes no overlapping region between the first gate 2 and the second gate 10 and the source 8 and the drain 9, thereby fundamentally avoiding the parasitic capacitance and improving the performance of the array substrate.

Preferably, the first gate 2, the third insulating layer 6 and the second gate 10 are sequentially connected to the source 8 and the drain 9 in the width direction (i.e., the width direction in the direction of the arrow in FIG. 1). In this way, there is not only no overlapping region but also no gap region between the first gate 2, the second gate 10 and the source 8 and the drain 9. The disclosure not only can avoid the generation of parasitic capacitance, but also can prevent the generation of parasitic resistance, which greatly improves the performance of the array substrate.

In a preferred embodiment of the disclosure, the material of the first gate 2 is an opaque metal. Preferably, the material of the first gate 2 in an embodiment of the disclosure includes one or more of chromium, molybdenum, titanium, aluminum, copper, and silver, but is not limited to this.

In a preferred embodiment of the disclosure, materials of the active layer 4, the second gate 10, the source 8, and the drain 9 are the same or different.

Preferably, in an embodiment of the disclosure, the active layer 4 and the second gate 10 are made of the same material, such as molybdenum, titanium, copper, aluminum, indium tin oxide, or aluminum zinc oxide, but are not limited to this. And the electron concentration of the second gate 10, the source 8, and the drain 9 is greater than $10^{18}/cm^3$.

Figure 2A:
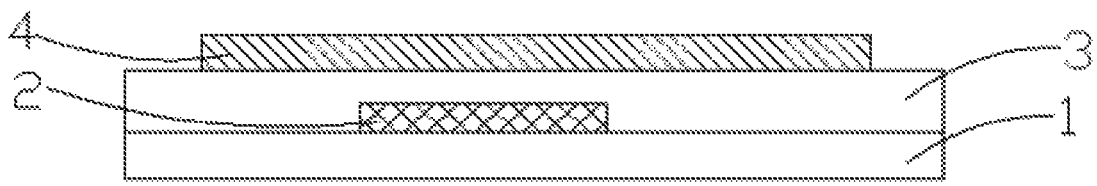
FIG. 2a to FIG. 2g are steps of fabricating the array substrate according to the embodiment of the disclosure.

Referring to FIGS. 2a to 2g and FIG. 3, the second aspect of the embodiment of the disclosure provides a fabricating method of an array substrate, including the following steps:

referring to FIG. 2a, Step 1: providing a substrate 1, forming a first gate 2 on the substrate 1 by magnetron sputtering or thermal evaporation, and forming a first gate 2 as a predetermined pattern by a photolithographic process. Next, forming a first insulating layer 3 by plasma enhanced chemical vapor deposition to cover the first gate 2 and the substrate 1. Then, depositing an active layer 4 on the first insulating layer 3 by magnetron sputtering, and patterning the active layer 4 by a lithography process to form a predetermined pattern.

Figure 2B:
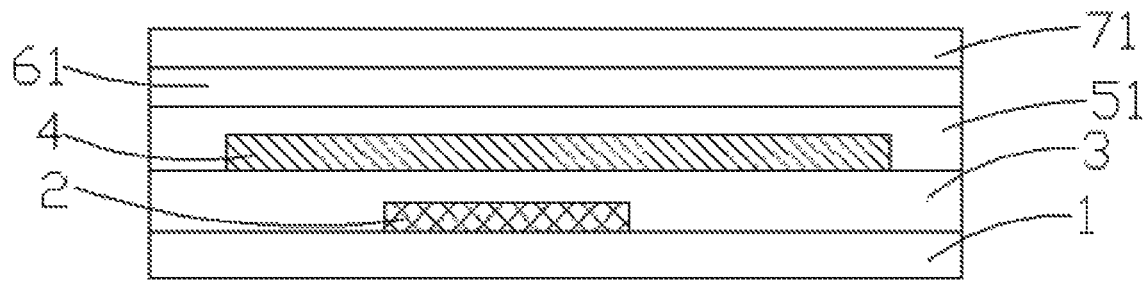

Referring to FIG. 2b, Step 2: firstly, sequentially depositing a second insulating layer material 51 on the first insulating layer 3 and the active layer 4, and then sequentially depositing a third insulating layer material 61 and a photoresist layer 71 on the second insulating layer material 51 to prepare for the subsequent lithography and etching processes. Preferably, the first insulating layer 3, the active layer 4, the second insulating layer 51, and the third insulating layer 61 have a light transmittance greater than 50%.

Figure 2C:
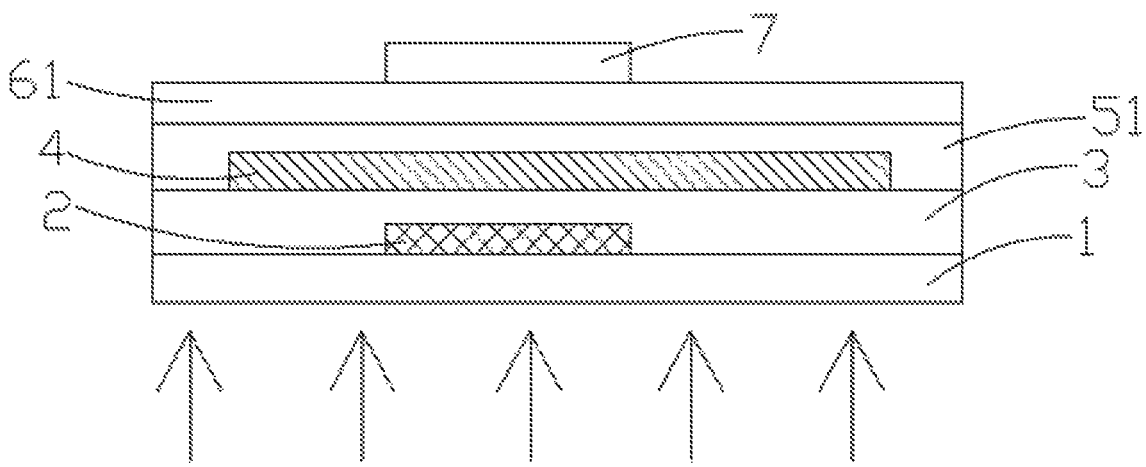

Referring to FIG. 2c, Step 3: by using the first gate 2 as a mask, patterning the photoresist layer 71 from a side of the substrate 1 away from the first gate 2 (in the direction of the arrow in the figure) by a lithography process to form a photoresist layer 7, so as to make the photoresist layer 7 coincide with the orthographic projection of the first gate 2.

The photoresist layer 7 is prepared as a reference material for subsequent fabrication of forming a first self-alignment of the first gate 2 and the second gate 10 and forming a double self-alignment of the second gate 10 and the source 8 and the drain 9.

Figure 2D:
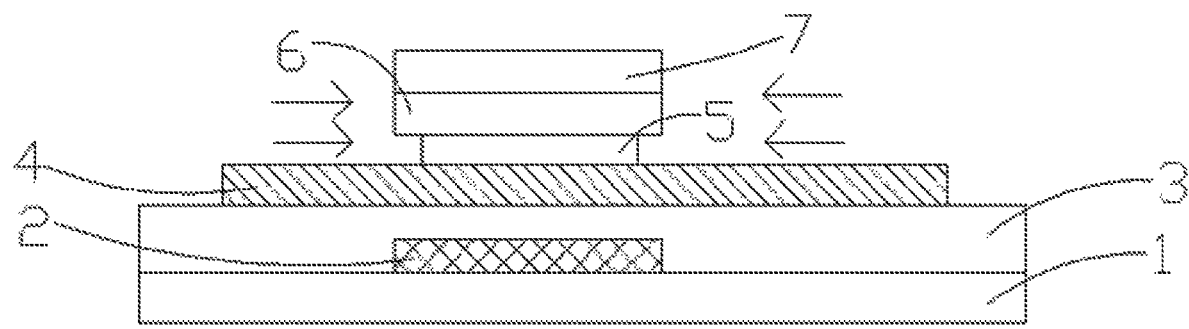

Referring to FIG. 2d, Step 4: etching the second insulating layer material 51 and the third insulating layer material 61, and side etching the second insulating layer material 51 and the third insulating layer material 61 from the two opposite sides to middle to finally form the second insulating layer 5 and the third insulating layer 6, so as to make the third insulating layer 6 coincide with the orthographic projection of the photoresist layer 7 after patterning, and the distance between the edge of the insulating layer 5 and the source 8 and the drain 9 is greater than the distance between the edge of the third insulating layer 6 and the source 8 and the drain 9.

Figure 2E:
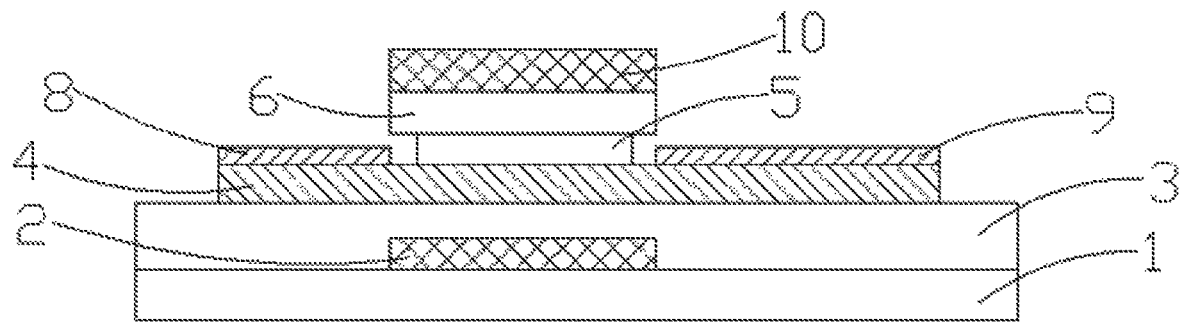

Referring to FIG. 2e, Step 5: removing the photoresist layer 7 after patterning by using a flushing method, and subsequently depositing a second metal layer on the active layer 4 to form the source 8, the drain 9 and the second gate 10 simultaneously; and patterning the source 8, the drain 9, and the second gate 10 into a predetermined pattern by lithography. The other functional layers and the pixel electrodes 14 are subsequently deposited.

Figure 2F:
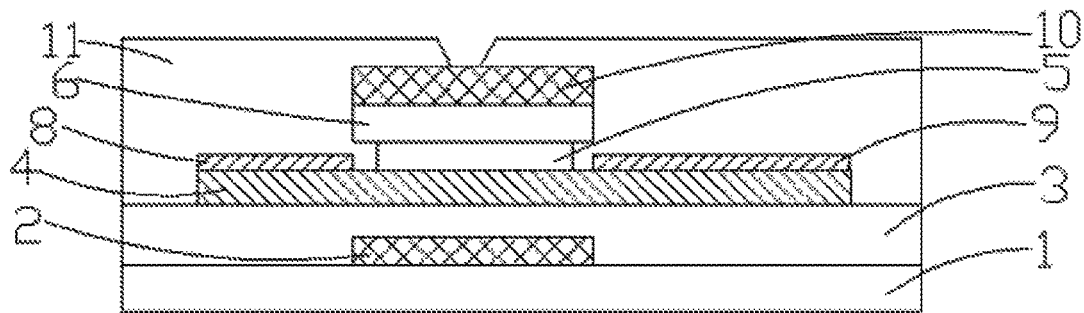

Referring to FIG. 2f, Step 6: After depositing the second gate 10, the method further includes depositing a fourth insulating layer 11 on the second gate 10 so as to make the fourth insulating layer 11 cover the active layer 4, the source 8, the drain 9, the second insulating layer 5, the third insulating layer 6, and the second gate 10, and patterning the fourth insulating layer 11 by a lithography process, and forming a first through hole on the fourth insulating layer 11 by a lithography process to partially expose the second gate 10.

Figure 2G:
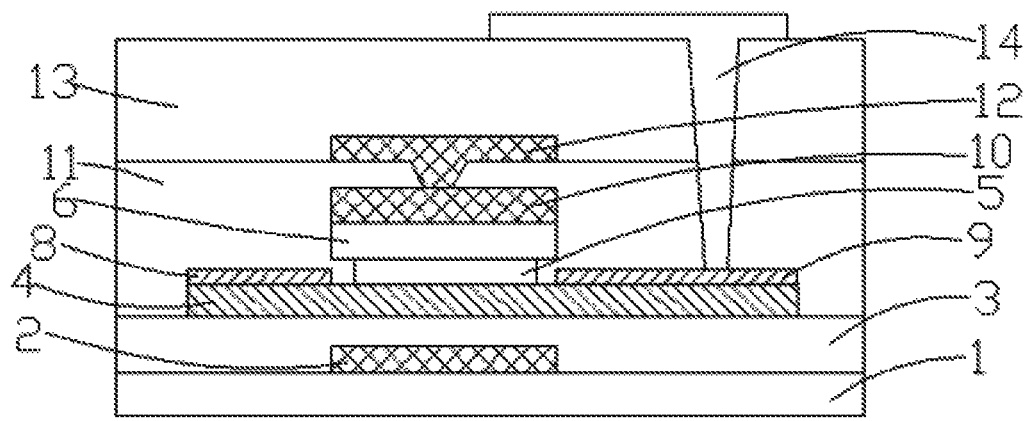
Figure 3:
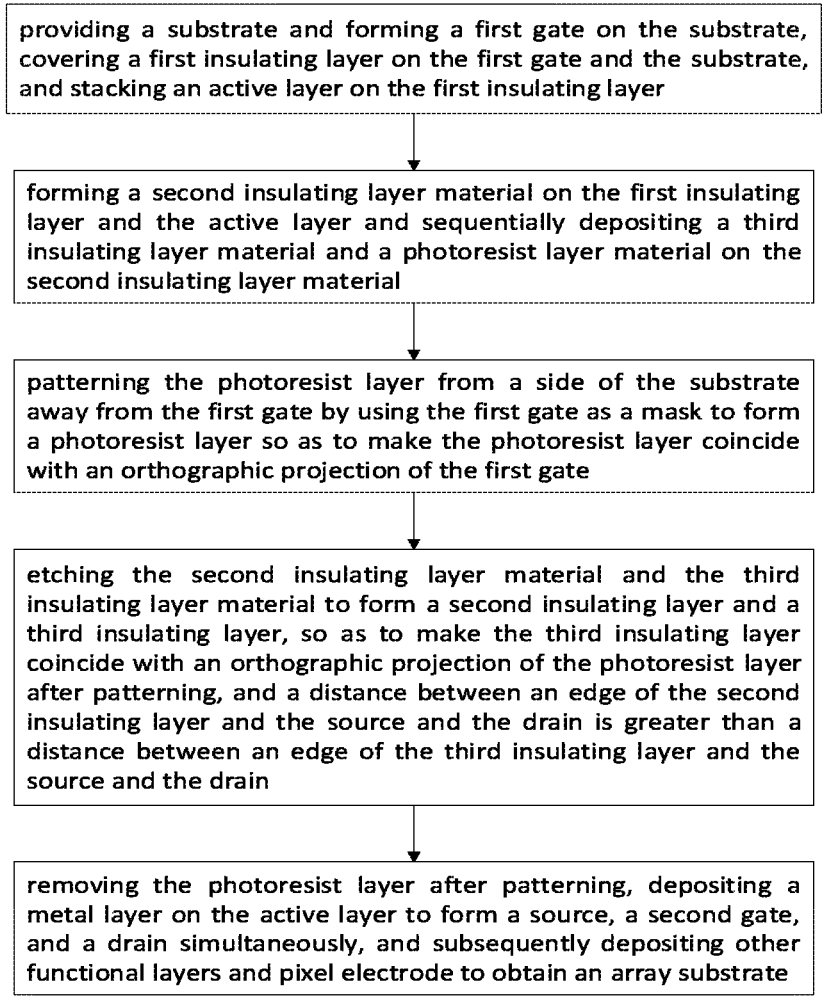
FIG. 3 is a flowchart of a fabricating method for an array substrate according to the embodiment of the disclosure.

Referring to FIG. 2g. Step 7: the specific operation of depositing the pixel electrode 14 is to deposit the third gate 12 at the first through hole and pattern the third gate 12 by a lithography process to form the predetermined pattern. And the distance between the edge of the third gate 12 and the source 8 and the drain 9 is greater than the distance between the edge of the second gate 10 and the source 8 and the drain 9. The third gate 12 may be one of various conductive materials. The fifth insulating layer 13 is deposited on the third gate 12, and then a second through hole is formed on the fifth insulating layer by a lithography process to partially expose the drain 9. The pixel electrode 14 is deposited at the second through hole, and then the pixel electrode 14 is patterned by a lithography process to finally form the array substrate.

Through the preparation of Steps 1 to 4, a double self-aligning effect is naturally formed when the source 8, the drain 9, and the second gate 10 are formed in Step 5. Firstly, the self-aligning effect of the first gate 2 and the second gate 10 is that the photoresist layer 71 is etched by using the first gate 2 as a mask so as to make the first gate 2 and the photoresist layer 7 form the self-aligning effect. And the second insulating layer 5 and the third insulating layer 6 are positioned and etched through the photoresist layer 7 to make the first gate 2, the photoresist layer 7, and the third insulating layer 6 form the self-aligning effect. After removing the photoresist layer 7, the deposited second gate 10 replaces the original photoresist layer 7. Therefore, the first gate 2 and the second gate 10 naturally achieve the first self-aligning effect.

Secondly, the second self-aligning effect of the second gate 10 and the source 8 and the drain 9 is that the distance between the edge of the second insulating layer 5 and the source 8 and the drain 9 is greater than the distance between the edge of the second insulating layer 5 and the source 8 and the drain 9. Therefore, when the source 8, the drain 9 and the second gate 10 are deposited, the second gate 10 is naturally separated from the source 8 and the drain 9, and no overlapping region is formed. Therefore, the second gate 10, the source 8, and the drain 9 achieve a double self-aligning effect. Due to the first self-aligning effect of the first gate 2 and the second gate 10, the self-aligning effect between the first gate 2, the source 8, and the drain 9 is also achieved, and no overlapping region is generated. Therefore, the double self-aligning effect makes no overlapping region between the first gate 2 and the second gate 10 and the source 8 and the drain 9, thereby fundamentally avoiding the generation of the parasitic capacitance and improving the performance of the array substrate. According to the second aspect of the disclosure, a fabricating method of an array substrate completely avoids the generation of the parasitic capacitance and improves the performance of the array substrate. The fabricating method of the array substrate is simple and easy to operate, has low cost, and is suitable for industrial production.

In a preferred embodiment of the disclosure, in the step of etching the second insulating layer 5 and the third insulating layer 6, the etching includes wet etching or dry etching. Preferably, the etching is wet etching. The etching rate of two opposite sides of the third insulating layer 6 is less than the etching rate of two opposite sides of the second insulating layer 5 so as to realize the distance between the edge of the second insulating layer 5 after etching and the source 8 and the drain 9 is greater than the distance between the edge of the third insulating layer 6 after etching and the source 8 and the drain 9.

In the preferred embodiment of the disclosure, the distance between the edge of the third gate 12, and the source 8 and the drain 9 is greater than the distance between the edge of the second gate 10 and the source 8 and the drain 9.

In a preferred embodiment of the disclosure, a thickness of the source 8 and the drain 9 is less than a sum of the thicknesses of the second insulating layer 5 and the third insulating layer 6. In this way, the second gate 10 is separated from the source 8 and the drain 9 in the thickness direction, and the second gate 10 does not have an overlapping region with the source 8 and the drain 9 in the width direction, and the second gate 10, the source 8 and the drain 9 are not connected together, preventing the occurrence of a short circuit.

In a preferred embodiment of the disclosure, the material of the second insulating layer and/or the third insulating layer includes silicon oxide, silicon nitride, silicon oxynitride, or aluminum oxide. The materials of the second insulating layer 5 and the third insulating layer 6 may be the same or different. In an embodiment of the disclosure, the materials of the second insulating layer 5 and the third insulating layer 6 are different, so that the etching process can be better controlled to make the width of the second insulating layer 5 smaller than the width of the third insulating layer 6.

In a preferred embodiment of the disclosure, the first insulation layer 3, the second insulation layer 5, the third insulation layer 6, and the active layer 4 have a light transmittance greater than 50%, so that the light source can be well through the array substrate.

In a preferred embodiment of the disclosure, a material of the active layer 4 is a semiconductor material including one or more of silicon oxide, germanium oxide, indium oxide, gallium oxide, and zinc oxide. The active layer has an electron concentration less than $10^{18}$/cm$^3$.

The array substrate and the fabricating method provided in the embodiments of the disclosure are described in detail above. The principles and implementation manners of the disclosure are described and illustrated herein. The above description is only for helping to understand the method and the core idea of the disclosure. Meanwhile, those skilled in the art can make changes to the specific implementation manners and the application scope according to the idea of the disclosure. In view of the foregoing, the content of the specification should not be construed as limiting the disclosure.

What is claimed is:

1. A fabricating method of an array substrate, comprising the following steps:
    providing a substrate and forming a first gate on the substrate, covering a first insulating layer on the first gate and the substrate, and stacking an active layer on the first insulating layer;
    forming a second insulating layer material on the first insulating layer and the active layer and sequentially depositing a third insulating layer material and a photoresist layer material on the second insulating layer material;
    patterning the photoresist layer from a side of the substrate away from the first gate by using the first gate as a mask to form a photoresist layer so as to make the photoresist layer coincide with an orthographic projection of the first gate;
    etching the second insulating layer material and the third insulating layer material to form a second insulating layer and a third insulating layer, so as to make the third insulating layer coincide with an orthographic projection of the photoresist layer after patterning, and a distance between an edge of the second insulating layer and the source and the drain is greater than a distance between an edge of the third insulating layer and the source and the drain; and
    removing the photoresist layer after patterning, depositing a metal layer on the active layer to form a source, a second gate, and a drain simultaneously, and subsequently depositing other functional layers and pixel electrode to obtain an array substrate.

2. The fabricating method according to claim 1, wherein a thickness of the source and the drain is less than a sum of thicknesses of the second insulating layer and the third insulating layer.

3. The fabricating method according to claim 1, wherein after the step of depositing the second gate, further comprises depositing a fourth insulating layer on the second gate so as to make the fourth insulating layer cover the active layer, the source, the drain, the second insulating layer, the third insulating layer, and the second gate, and forming a first through hole on the fourth insulating layer by a lithography process to partially expose the second gate.

4. The fabricating method according to claim 1, wherein a specific operation of depositing the pixel electrode is depositing a third gate at the first through hole and depositing a fifth insulating layer on the third gate, and then forming a second through hole on the fifth insulating layer to partially expose the drain and depositing a pixel electrode at the second through hole.

5. The fabricating method according to claim 4, wherein the distance between an edge of the third gate and the source and the drain is greater than the distance between an edge of the second gate and the source and the drain.

6. The fabricating method according to claim 1, wherein in the step of etching the second insulating layer and the third insulating layer, an etching rate of two opposite sides of the third insulating layer is less than an etching rate of two opposite sides of the second insulating layer.

7. The fabricating method according to claim 6, wherein a material of the second insulating layer and/or the third insulating layer comprises silicon oxide, silicon nitride, silicon oxynitride, or aluminum oxide.

8. The fabricating method according to claim 6, wherein the first insulating layer, the second insulating layer, the third insulating layer, and the active layer have a light transmittance more than 50%.

* * * * *